United States Patent
Wei et al.

(10) Patent No.: US 10,566,361 B2
(45) Date of Patent: Feb. 18, 2020

(54) WIDE CHANNEL GATE STRUCTURE AND METHOD OF FORMING

(71) Applicant: TAIWAN SEMICONDUCTOR MANUFACTURING COMPANY, LTD., Hsinchu (TW)

(72) Inventors: Chia-Yu Wei, Tainan (TW); Fu-Cheng Chang, Tainan (TW); Hsin-Chi Chen, Tainan (TW); Ching-Hung Kao, Tainan (TW); Chia-Pin Cheng, Kaohsiung (TW); Kuo-Cheng Lee, Tainan (TW); Hsun-Ying Huang, Tainan (TW); Yen-Liang Lin, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/591,689

(22) Filed: May 10, 2017

(65) Prior Publication Data
US 2018/0166481 A1    Jun. 14, 2018

Related U.S. Application Data

(60) Provisional application No. 62/434,297, filed on Dec. 14, 2016.

(51) Int. Cl.
*H01L 27/146* (2006.01)
*H01L 29/423* (2006.01)
*H01L 29/78* (2006.01)
*H01L 29/06* (2006.01)

(52) U.S. Cl.
CPC .. *H01L 27/14614* (2013.01); *H01L 27/14643* (2013.01); *H01L 29/0653* (2013.01); *H01L 29/4236* (2013.01); *H01L 29/42376* (2013.01); *H01L 29/78* (2013.01); *H01L 29/7853* (2013.01)

(58) Field of Classification Search
CPC ............. H01L 27/14614; H01L 27/088; H01L 29/0649; H01L 29/401; H01L 29/42376
USPC ........................................................ 257/292
See application file for complete search history.

(56) References Cited

U.S. PATENT DOCUMENTS 6,596,599 B1 *   7/2003   Guo ................. H01L 21/28114
                                                                257/E21.205

* cited by examiner

*Primary Examiner* — Hrayr A Sayadian
(74) *Attorney, Agent, or Firm* — Hauptman Ham, LLP

(57) ABSTRACT

A gate structure includes a gate and a first isolation structure having a top surface and a bottom surface. The gate includes a first sidewall adjacent to the first isolation structure, a second sidewall, a first horizontal surface adjacent to a bottom edge of the first sidewall and a bottom edge of the second sidewall, the first horizontal surface being between the top surface of the first isolation structure and the bottom surface of the first isolation structure. The gate also includes a second horizontal surface adjacent to a top edge of the second sidewall. An effective channel width defined by the gate structure includes a height of the second sidewall and a width of the second horizontal surface.

20 Claims, 8 Drawing Sheets

WIDE CHANNEL GATE STRUCTURE AND METHOD OF FORMING

BACKGROUND

Integrated circuits commonly include field effect transistors (FETs), in which a source region and a drain region are separated by a channel. A number of properties of a FET are determined by channel geometry, including channel width. Channel geometry is defined in part by the structure of a gate used to control current flow in the channel.

Properties of a FET affect the properties of the integrated circuit that includes the FET. For example, image sensors that include FETs as reset transistors, transfer gates, selection transistors, or source followers have properties that are affected by the gate structures of the corresponding FETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
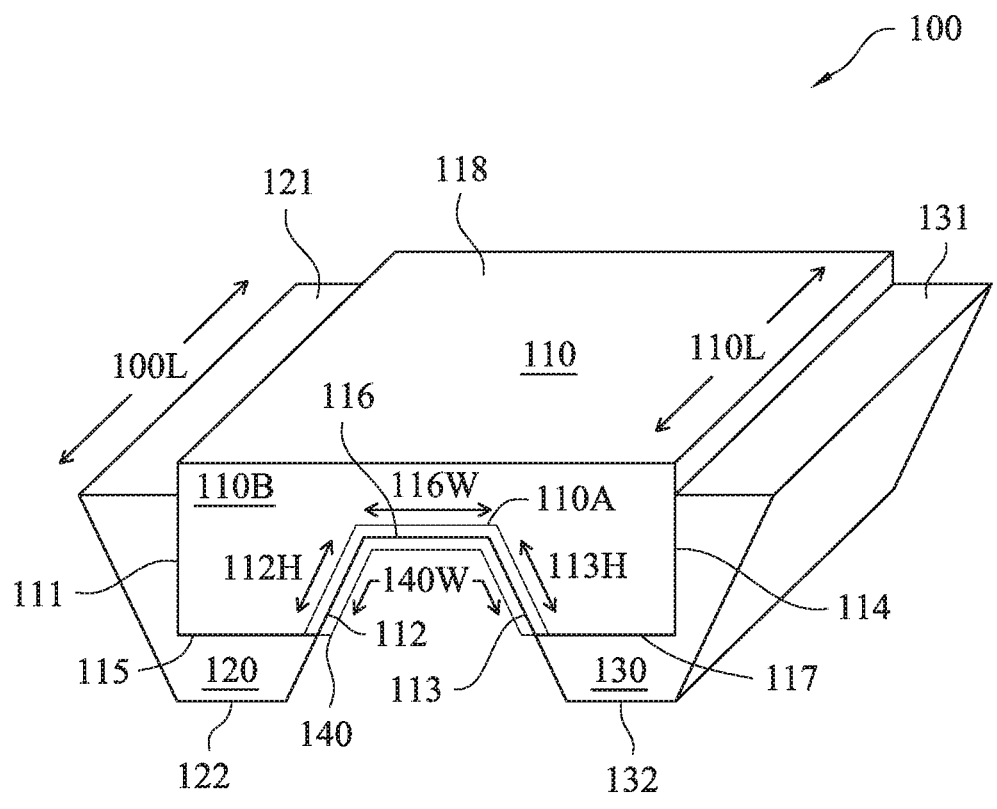
FIGS. 1A and 1B are diagrams of a gate structure, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a gate structure is formed in a substrate by etching at least a portion of an isolation structure to expose at least one sidewall of the substrate. In various embodiments, a gate formed in the etched isolation structure includes at least one sidewall along the sidewall of the substrate and at least one horizontal surface such that an effective channel width defined by the gate structure includes a height of the sidewall and a width of the horizontal surface.

Figure 1B:
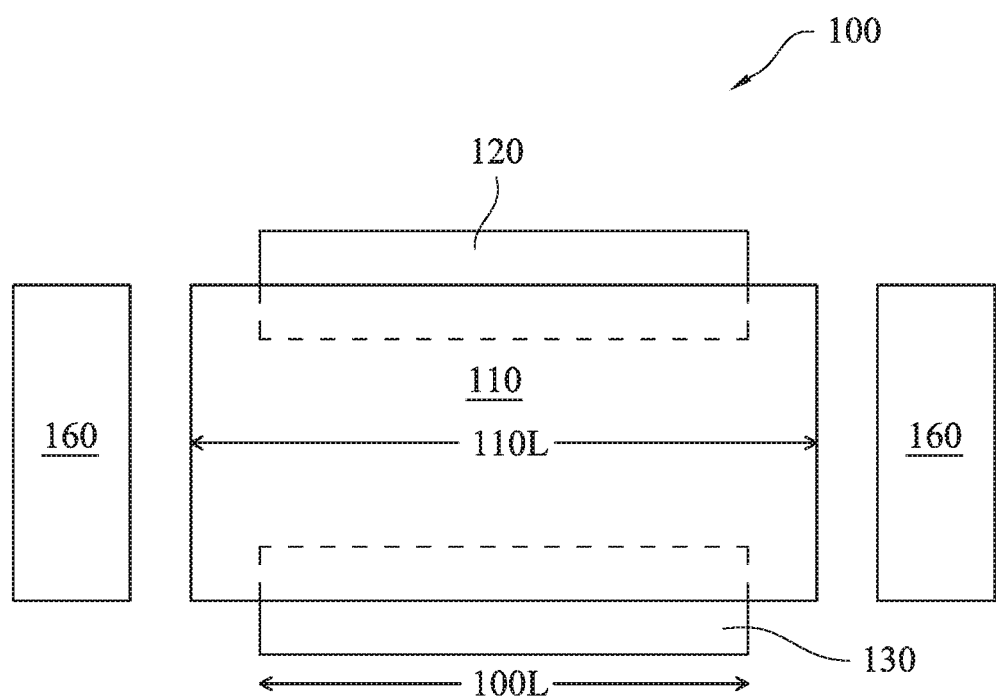

FIGS. 1A and 1B are diagrams of a gate structure 100, in accordance with some embodiments. FIG. 1A is a diagram based on a perspective view of gate structure 100, and FIG. 1B is a diagram based on a top view of gate structure 100. In addition to gate structure 100, FIG. 1A depicts a channel 140 in a substrate 150, and FIG. 1B depicts source/drain regions 160.

Gate structure 100 includes a gate 110, an isolation structure 120, and an isolation structure 130. A first portion of gate 110 (not labeled) is positioned adjacent to isolation structure 120, a second portion of gate 110 (not labeled) is positioned adjacent to isolation structure 130, and a third portion of gate 110 (not labeled) extends between the first and second portions and over substrate 150. In some embodiments, gate structure 100 does not include isolation structure 130, and gate 110 does not include the second portion adjacent to isolation structure 130. In some embodiments, gate structure 100 includes isolation structure 130, and gate 110 does not includes the second portion adjacent to isolation structure 130.

Gate 110 is a region that includes an insulation layer 110A and a gate electrode 110B. Insulation layer 110A is a layer that includes one or more layers of materials capable of electrically insulating gate electrode 110B from substrate 150 and capacitively coupling gate electrode 110B and substrate 150. In various embodiments, insulation layer 110A includes one or more of silicon dioxide ($SiO_2$), a high-K dielectric, a protection layer, an insulator film, stacked/multi-insulator films, or other suitable material.

In some embodiments, insulation layer 110A includes a single insulation layer. In some embodiments, insulation layer 110A includes a plurality of insulation layers.

Gate electrode 110B is a region that includes one or more materials capable of storing an electric charge. In various embodiments, gate electrode 110B includes one or more electrically conductive materials, non-limiting examples of which include polysilicon, aluminum (Al) or other metals, indium-tin-oxide (ITO), or other suitable materials. In some embodiments, gate electrode 110B includes one or more work-function metal layers.

Isolation structures 120 and 130 are regions of one or more materials capable of electrically isolating adjacent regions of substrate 150 from each other. In various embodiments, isolation structures 120 and 130 include an oxide such as $SiO_2$, a semiconductor material, or other suitable material. In some embodiments, one or both of isolation structures 120 or 130 is a shallow trench isolation (STI) structure.

Substrate 150 is a structure that includes one or more materials capable of forming the basis of one or more integrated circuits. In various embodiments, substrate 150 includes one or more of a semiconductor material such as silicon or germanium, a compound semiconductor material such as gallium arsenide, indium arsenide, indium phosphide, or silicon carbide, or other suitable material.

Source/drain regions 160 are regions of substrate 150 that are capable of controlled electrical conduction. In various embodiments, one or more of source/drain regions 160 includes one or more of a doped semiconductor material such as silicon or germanium, a compound semiconductor material such as gallium arsenide, indium arsenide, indium phosphide, or silicon carbide, or other suitable material. In some embodiments, one or more of source/drain regions 160 includes a same semiconductor material as substrate 150. In some embodiments, one or more of source/drain regions 160 includes a semiconductor material different from a semiconductor material included in substrate 150.

Referring to FIG. 1A, gate 110 includes sidewalls 111-114 and horizontal surfaces 115-118 in addition to insulation layer 110A and gate electrode 110B. Isolation structure 120 includes a top surface 121 and a bottom surface 122, and isolation structure 130 includes a top surface 131 and a bottom surface 132.

Sidewall 111 is adjacent to isolation structure 120. In the embodiment depicted in FIG. 1A, sidewall 111 extends above top surface 121. In some embodiments, sidewall 111 ends at top surface 121 and gate 110 has an additional sidewall (not shown) that is not aligned with sidewall 111 and extends above top surface 121. In some embodiments in which sidewall 111 ends at top surface 121, gate 110 extends over isolation structure 120, and a bottom edge of an additional sidewall of gate 110 is adjacent to top surface 121. In some embodiments in which sidewall 111 ends at top surface 121, gate 110 is set back from isolation structure 120, and a bottom edge of an additional sidewall is separated from top surface 121 by an additional horizontal surface of gate 110 (not shown).

Horizontal surface 115 is adjacent to a bottom edge (not labeled) of sidewall 111 and extends horizontally to a bottom edge (not labeled) of sidewall 112. In the embodiment depicted in FIG. 1A, horizontal surface 115 is between top surface 121 and bottom surface 122 such that a portion of isolation structure 120 is between horizontal surface 115 and bottom surface 122. In some embodiments, horizontal surface 115 is coplanar with bottom surface 122 such that the bottom edge of sidewall 111 is adjacent to bottom surface 122.

Sidewall 112 extends from horizontal surface 115 to horizontal surface 116 along substrate 150 for a height 112H. Horizontal surface 116 extends horizontally from a top edge (not labeled) of sidewall 112 to a top edge (not labeled) of sidewall 113 along substrate 150 for a width 116W. Sidewall 113 extends from horizontal surface 116 to horizontal surface 117 along substrate 150 for a height 113H. In some embodiments, height 113H is equal to height 112H. In some embodiments, height 113H is longer than height 112H. In some embodiments, height 112H is longer than height 113H.

Horizontal surface 117 extends from a bottom edge (not labeled) of sidewall 113 to a bottom edge (not labeled) of sidewall 114. In the embodiment depicted in FIG. 1A, horizontal surface 117 is between top surface 131 and bottom surface 132 such that a portion of isolation structure 130 is between horizontal surface 117 and bottom surface 132. In some embodiments, horizontal surface 117 is coplanar with bottom surface 132 such that the bottom edge of sidewall 114 is adjacent to bottom surface 132.

Sidewall 114 is adjacent to isolation structure 130. In the embodiment depicted in FIG. 1A, sidewall 114 extends above top surface 131. In some embodiments, sidewall 114 ends at top surface 131 and gate 110 has an additional sidewall (not shown) that is not aligned with sidewall 114 and extends above top surface 131. In some embodiments in which sidewall 114 ends at top surface 131, gate 110 extends over isolation structure 130, and a bottom edge of an additional sidewall of gate 110 is adjacent to top surface 131. In some embodiments in which sidewall 114 ends at top surface 131, gate 110 is set back from isolation structure 130, and a bottom edge of an additional sidewall is separated from top surface 131 by an additional horizontal surface of gate 110 (not shown).

Horizontal surface 118 is positioned above horizontal surface 116 and defines a top surface of gate 110. In the embodiments depicted in FIG. 1A, horizontal surface 118 extends from a top edge (not labeled) of sidewall 111 to a top edge (not labeled) of sidewall 114. In some embodiments, gate 110 has one or more additional sidewalls (not shown) that extend above top surface 121 and/or top surface 131, and horizontal surface 118 is adjacent to one or more top edges of the one or more additional sidewalls.

In the embodiment depicted in FIG. 1A, insulation layer 110A extends along sidewall 112, horizontal surface 116, and sidewall 113. In some embodiments, insulation layer 110A also extends at least partially along one or more of sidewall 111, horizontal surface 115, horizontal surface 117, or sidewall 114.

In some embodiments in which insulation layer 110A includes multiple insulation layers, the multiple layers provide protection against cracking at locations at which a sidewall such as sidewall 112 is adjacent to a horizontal surface such as horizontal surface 116.

Referring to FIGS. 1A and 1B, gate 110 has a length 110L, and each of isolation structures 120 and 130 has a length 100L. In some embodiments, length 110L is equal to length 100L. In some embodiments, length 110L is longer than length 100L. In some embodiments, length 110L is shorter than length 100L.

Source/drain regions 160 are positioned at each end of gate 110 along the direction corresponding to length 100L.

Gate structure 100 thereby defines channel 140 having a length determined by length 110L and an effective width 140W determined by the portion or portions of gate 110 at which gate electrode 110B is capable of being capacitively coupled with substrate 150 through insulation layer 110A.

In the embodiment depicted in FIGS. 1A and 1B, gate electrode 110B is capable of being capacitively coupled with substrate 150 through insulation layer 110A along sidewall 112, horizontal surface 116, and sidewall 113, so gate structure 100 defines channel 140 having effective channel width 140W equal to the sum of heights 112H and 113H, and width 116W.

Because effective channel width 140W includes heights 112H and 113H, effective channel width 140W is larger than effective channel widths of similarly sized gate structures in other approaches that do not include sidewalls 112 and 113, for example approaches that include only horizontal surfaces to determine effective channel widths.

By defining a large effective channel width 140W relative to similarly sized structures without at least one of heights 112H or 113H, gate structure 100 enables FET operation in which device speed and signal-to-noise ratio are increased, thereby improving performance of FETs and FET circuits. As a non-limiting example, an image sensor circuit having one or more of a reset transistor, a transfer gate, a source follower, or a selection transistor that includes gate structure 100 has improved speed and signal-to-noise ratio properties compared to an image sensor circuit having transistors with gate structures defining effective channel widths narrower than those defined by gate structure 100.

Figure 2A:
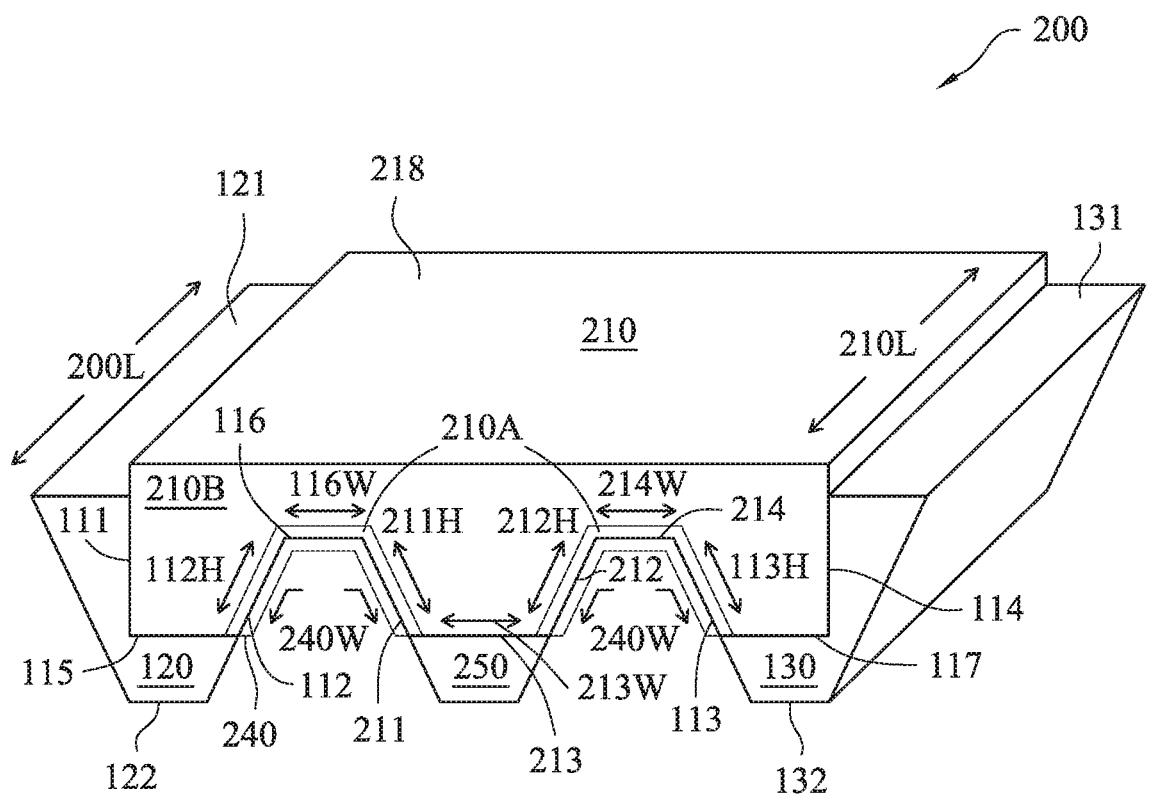
FIGS. 2A and 2B are diagrams of a gate structure, in accordance with some embodiments.
Figure 2B:
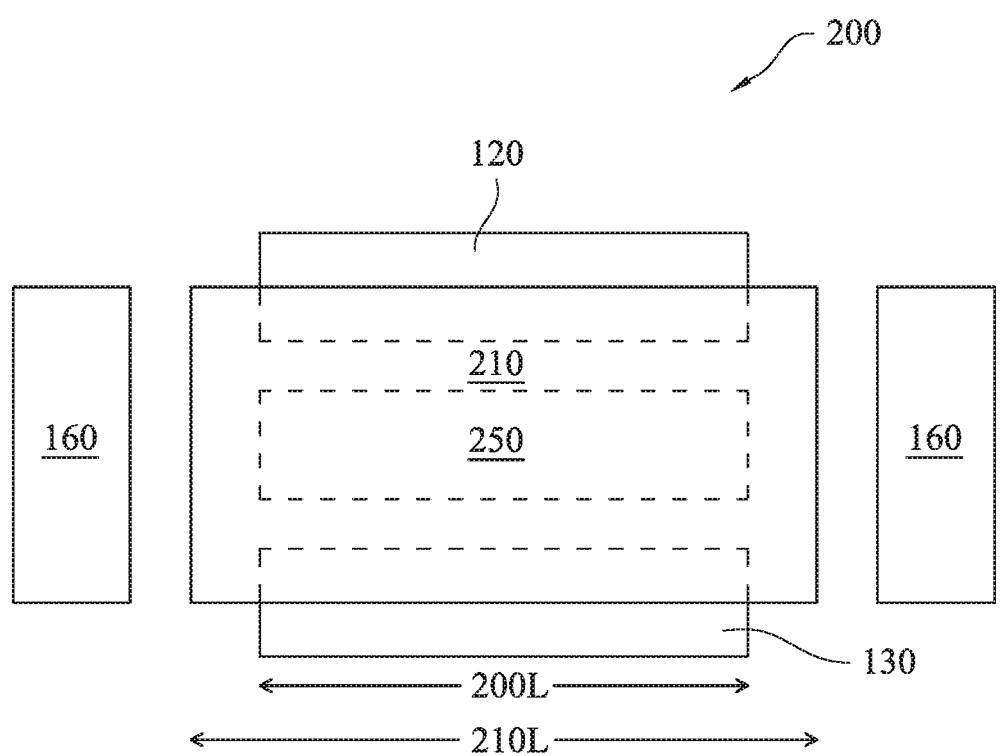

FIGS. 2A and 2B are diagrams of a gate structure 200, in accordance with some embodiments. FIG. 2A is a diagram based on a perspective view of gate structure 200, and FIG. 2B is a diagram based on a top view of gate structure 200. In addition to gate structure 200, FIG. 2A depicts substrate 150, and FIG. 2B depicts source/drain regions 160, each described above with respect to gate structure 100 and FIGS. 1A and 1B. In addition to gate structure 200, FIG. 2A depicts a channel 240 in substrate 150.

Gate structure 200 includes a gate 210, isolation structures 120 and 130, described above with respect to gate structure 100, and an isolation structure 250. Gate 110 includes three lower portions positioned adjacent to isolation structures 120, 130, and 250, respectively, and upper portions that extend between the lower portions over substrate 150.

Gate 210 includes an insulation layer 210A and a gate electrode 210B, similar to insulation layer 110A and gate electrode 110B, respectively, described above with respect to gate 110.

In addition to the features described above with respect to gate 110, gate 210 includes a sidewall 211 extending a height 211H along substrate 150, a sidewall 212 extending a height 212H along substrate 150, a horizontal surface 213 extending a width 213W from a bottom edge (not labeled) of sidewall 211 to a bottom edge (not labeled) of sidewall 212, and a horizontal surface 214 extending a width 214W along substrate 150 from a top edge (not labeled) of sidewall 212 to a top edge (not labeled) of sidewall 113.

In the embodiment depicted in FIGS. 2A and 2B, horizontal surface 213 extends along isolation structure 250. In some embodiments, gate structure 200 does not include isolation structure 250 and horizontal surface 213 extends along substrate 150 for the distance 213W.

Horizontal surface 218 is positioned above horizontal surfaces 116 and 214 and defines a top surface of gate 210.

Referring to FIG. 2B, gate 210 has a length 210L, and each of isolation structures 120, 130, and 250 has a length 200L. In some embodiments, length 210L is equal to length 200L. In some embodiments, length 210L is longer than length 200L. In some embodiments, length 210L is shorter than length 200L.

Gate structure 200 thereby defines channel 240 having a length determined by length 210L and an effective width 240W determined by the portion or portions of gate 210 at which gate electrode 210B is capable of being capacitively coupled with substrate 150 through insulation layer 210A.

In the embodiment depicted in FIGS. 2A and 2B, gate electrode 210B is capable of being capacitively coupled with substrate 150 through insulation layer 210A along sidewalls 112, 211, 212, and 113, and horizontal surfaces 116 and 214, so gate structure 200 defines channel 240 having effective channel width 240W equal to the sum of heights 112H, 211H, 212H, and 113H, and widths 116W, and 214W.

Because effective channel width 240W includes heights 112H, 211H, 212H, and 113H, effective channel width 240W is larger than effective channel widths of similarly sized gate structures in other approaches that do not include sidewalls 112, 211, 212, and 113, for example approaches that include only horizontal surfaces to determine effective channel widths.

In some embodiments in which gate structure 200 does not include isolation structure 250, i.e., horizontal surface 213 is coplanar with a bottom surface of isolation structure 250, effective gate width 240W also includes width 213W.

In the embodiments depicted in FIGS. 2A and 2B, gate structure 200 includes a single set of sidewalls 211 and 212 positioned between sidewalls 112 and 113. In some embodiments, gate structure 200 includes one or more sets of sidewalls (not shown) in addition to sidewalls 211 and 212 positioned between sidewalls 112 and 113 such that effective gate width 240W includes heights by which the additional sets of sidewalls extend along substrate 150. In some embodiments, additional sets of sidewalls are associated with additional isolation structures (not shown) similar to isolation structure 250.

By defining a relatively large effective channel width 240W, gate structure 200 is capable of providing the benefits described above for gate structure 100 with respect to improved speed and signal-to-noise ratio properties compared to gate structures defining relatively smaller effective channel widths.

Figure 3A:
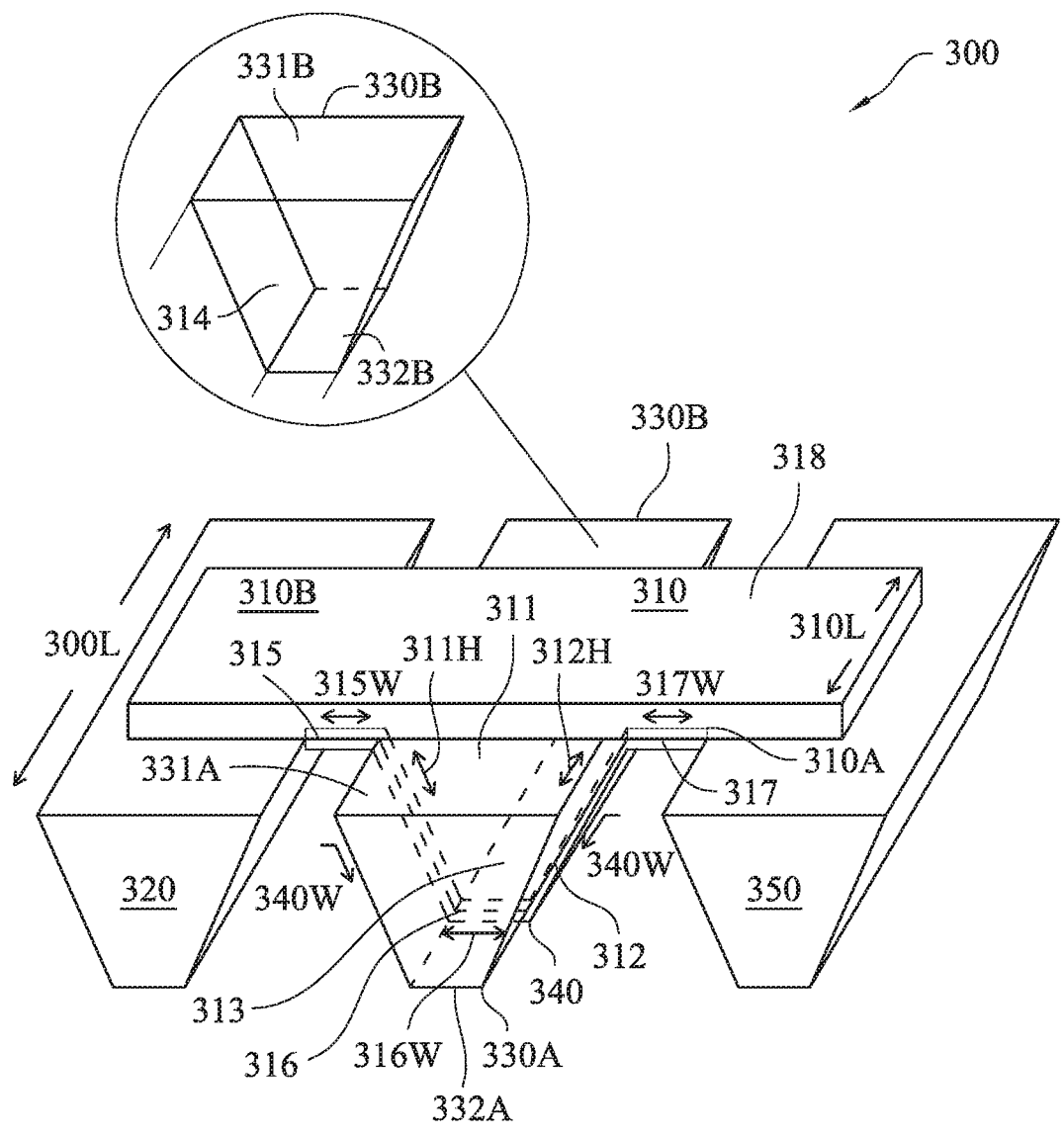
FIGS. 3A and 3B are diagrams of a gate structure, in accordance with some embodiments.
Figure 3B:
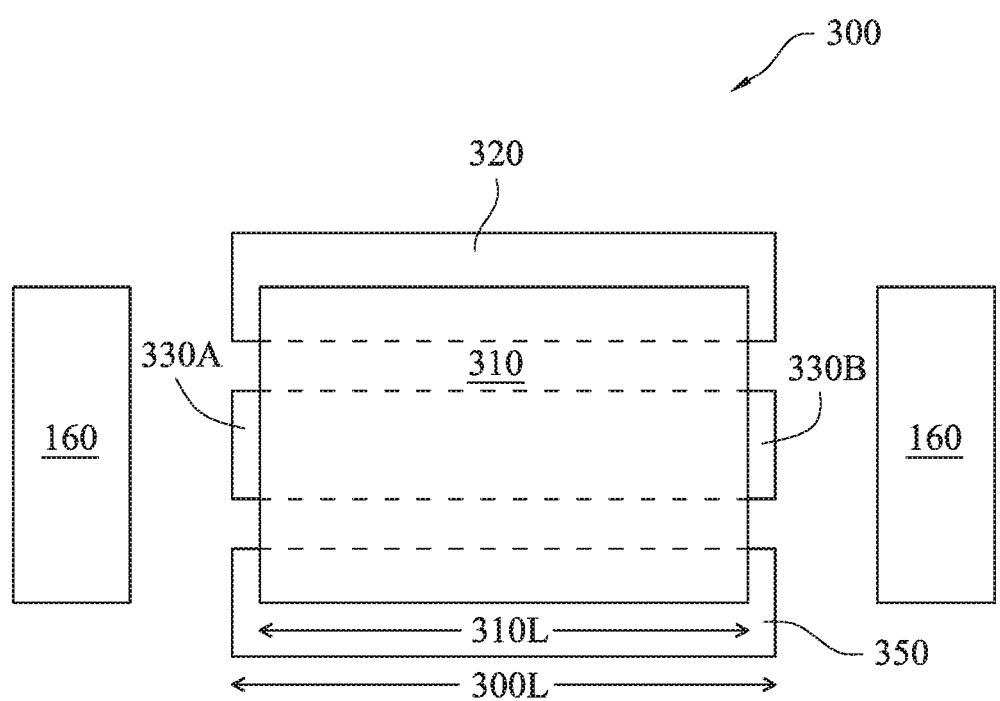

FIGS. 3A and 3B are diagrams of a gate structure 300, in accordance with some embodiments. FIG. 3A is a diagram based on a perspective view of gate structure 300, and FIG. 3B is a diagram based on a top view of gate structure 300. In addition to gate structure 300, FIG. 3A depicts substrate 150, and FIG. 3B depicts source/drain regions 160, each described above with respect to gate structure 100 and FIGS. 1A and 1B. In addition to gate structure 300, FIG. 3A depicts a channel 340 in substrate 150.

Gate structure 300 includes a gate 310 and isolation structures 320, 330A, 330B, and 350. FIG. 3A depicts isolation structure 330B both in relation to the overall arrangement of gate structure 300 and as a separate inset.

Gate 310 includes a lower portion (not labeled) positioned adjacent to and between isolation structures 330A and 330B and an upper portion (not labeled) that extends over substrate 150 from isolation structure 320 to isolation structure 350.

Isolation structure 330A includes a top surface 331A and a bottom surface 332A, and isolation structure 330B includes a top surface 331A and a bottom surface 332B.

Gate 310 includes an insulation layer 310A and a gate electrode 310B, similar to insulation layer 110A and gate electrode 110B, respectively, described above with respect to gate 110.

Referring to FIG. 3A, gate 310 includes sidewalls 311-314 and horizontal surfaces 315-317. Horizontal surface 315 extends along substrate 150 from a top edge of isolation structure 320 to a top edge (not labeled) of sidewall 311 for a width 315W. In some embodiments, horizontal surface 315 is coplanar with top surfaces 331A and 331B.

Sidewall 311 extends along substrate 150 from horizontal surface 315 to horizontal surface 316 for a height 311H.

Horizontal surface 316 extends along substrate 150 from a bottom edge (not labeled) of sidewall 311 to a bottom edge (not labeled) of sidewall 312 for a width 316W. In some embodiments, horizontal surface 316 is coplanar with bottom surfaces 332A and 332B.

Sidewall 312 extends along substrate 150 from horizontal surface 316 to horizontal surface 317 for a height 312H.

Horizontal surface 317 extends along substrate 150 from a top edge (not labeled) of sidewall 312 to a top edge of isolation structure 350 for a width 317W. In some embodiments, horizontal surface 317 is coplanar with top surfaces 331A and 331B.

Sidewall 313 is adjacent to horizontal surface 316 and isolation structure 330A, and both adjacent to and perpendicular to sidewalls 311 and 312. Sidewall 314 is adjacent to horizontal surface 316 and isolation structure 330B, and both adjacent to and perpendicular to sidewalls 311 and 312.

In some embodiments, gate structure 300 does not include one or both of isolation structures 320 or 350, and one or both of widths 315W or 317W is the respective distance that horizontal surface 315 or 317 otherwise extends along substrate 150.

A horizontal surface 318 is positioned above horizontal surface 316 and defines a top surface of gate 310.

Referring to FIG. 3B, gate 310 has a length 310L, and each of isolation structures 320 and 350 has a length 300L. In some embodiments, length 310L is equal to length 300L. In some embodiments, length 310L is longer than length 300L. In some embodiments, length 310L is shorter than length 300L.

In some embodiments in which length 310L is shorter than length 300L, isolation structures 330A and 330B are positioned to have outer sidewalls separated by length 300L. In some embodiments in which length 310L is longer than or equal to length 300L, gate structure 300 does not include isolation structures 330A and 330B, and each of sidewalls 313 and 314 is adjacent to a corresponding sidewall of substrate 150.

Gate structure 300 thereby defines a channel 340 having a length determined by length 310L and an effective width 340W determined by the portion or portions of gate 310 at which gate electrode 310B is capable of being capacitively coupled with substrate 150 through insulation layer 310A.

In the embodiment depicted in FIGS. 3A and 3B, gate electrode 310B is capable of being capacitively coupled with substrate 150 through insulation layer 310A along sidewalls 311 and 312 and horizontal surfaces 315-317, so gate structure 300 defines a channel (not shown) having an effective channel width equal to the sum of heights 311H and 312H, and widths 315W, 316W, and 317W.

Because the effective channel width defined by gate structure 300 includes heights 311H and 312H, the effective channel width is larger than effective channel widths of similarly sized gate structures in other approaches that do not include sidewalls 311 and 312, for example approaches that include only horizontal surfaces to determine effective channel widths.

In the embodiments depicted in FIGS. 3A and 3B, gate structure 300 includes a single set of sidewalls 311-314 positioned in substrate 150. In some embodiments, gate structure 300 includes one or more sets of sidewalls (not shown) in addition to sidewalls 311-314 positioned in substrate 150 such that the effective gate width includes heights by which the additional sets of sidewalls extend along substrate 150. In some embodiments, additional sets of sidewalls are associated with additional isolation structures (not shown) similar to isolation structures 330A and 330B.

By defining a large effective channel width relative to similarly sized structures without at least one of heights 311H or 312H, gate structure 300 is capable of providing the benefits described above for gate structure 100 with respect to improved speed and signal-to-noise ratio properties.

Figure 4:
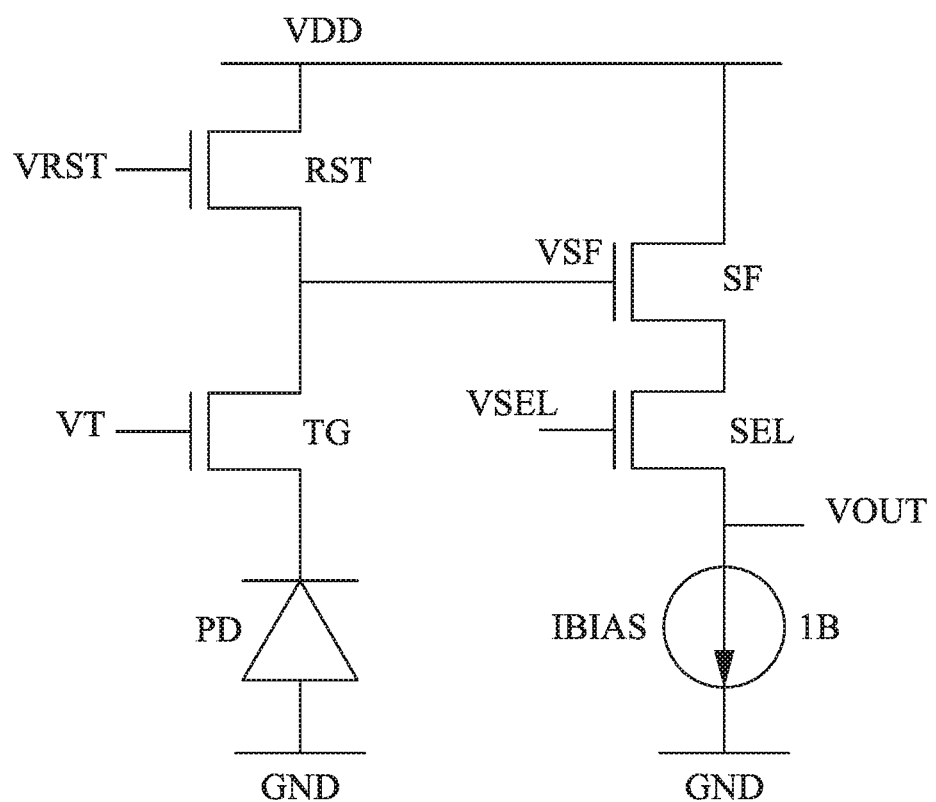
FIG. 4 is a schematic diagram of an image sensor circuit, in accordance with some embodiments.

FIG. 4 is a schematic diagram of an image sensor circuit 400, in accordance with some embodiments. Image sensor circuit 400 includes a first power node VDD and a second power node GND. A reset transistor RST, transfer gate TG, and photodiode PD are configured in series between first power node VDD and second power node GND. A source follower SF, selection transistor SEL, and current source IB are also configured in series between first power node VDD and second power node GND.

Reset transistor RST is configured to receive signal VRST, transfer gate TG is configured to receive signal VT, and selection transistor SEL is configured to receive signal VSEL. Photodiode PD is configured to generate a signal based on a detected light input (not shown). Current source IB is configured to generate a current IBIAS.

A gate of source follower SF is configured to receive a voltage VSF generated between reset transistor RST and transfer gate TG in response to the signal generated by photodiode PD. Image sensor circuit 400 is thereby configured to output a signal VOUT representative of the light input detected by photodiode PD, and responsive to signals VRST, VT, and VSEL.

At least one of reset transistor RST, transfer gate TG, source follower SF, or selection transistor SEL is a FET including one of gate structures 100, 200, or 300, described above with respect to FIGS. 1A and 1B, 2A and 2B, or 3A and 3B, respectively.

By including a transistor with a gate structure defining a large effective channel width relative to similarly sized structures without at least one of heights 112H, 113H, 211H, 212H, 311H, or 312H, image sensor circuit 400 is capable of operating with improved speed and signal-to-noise ratio properties.

Figure 5:
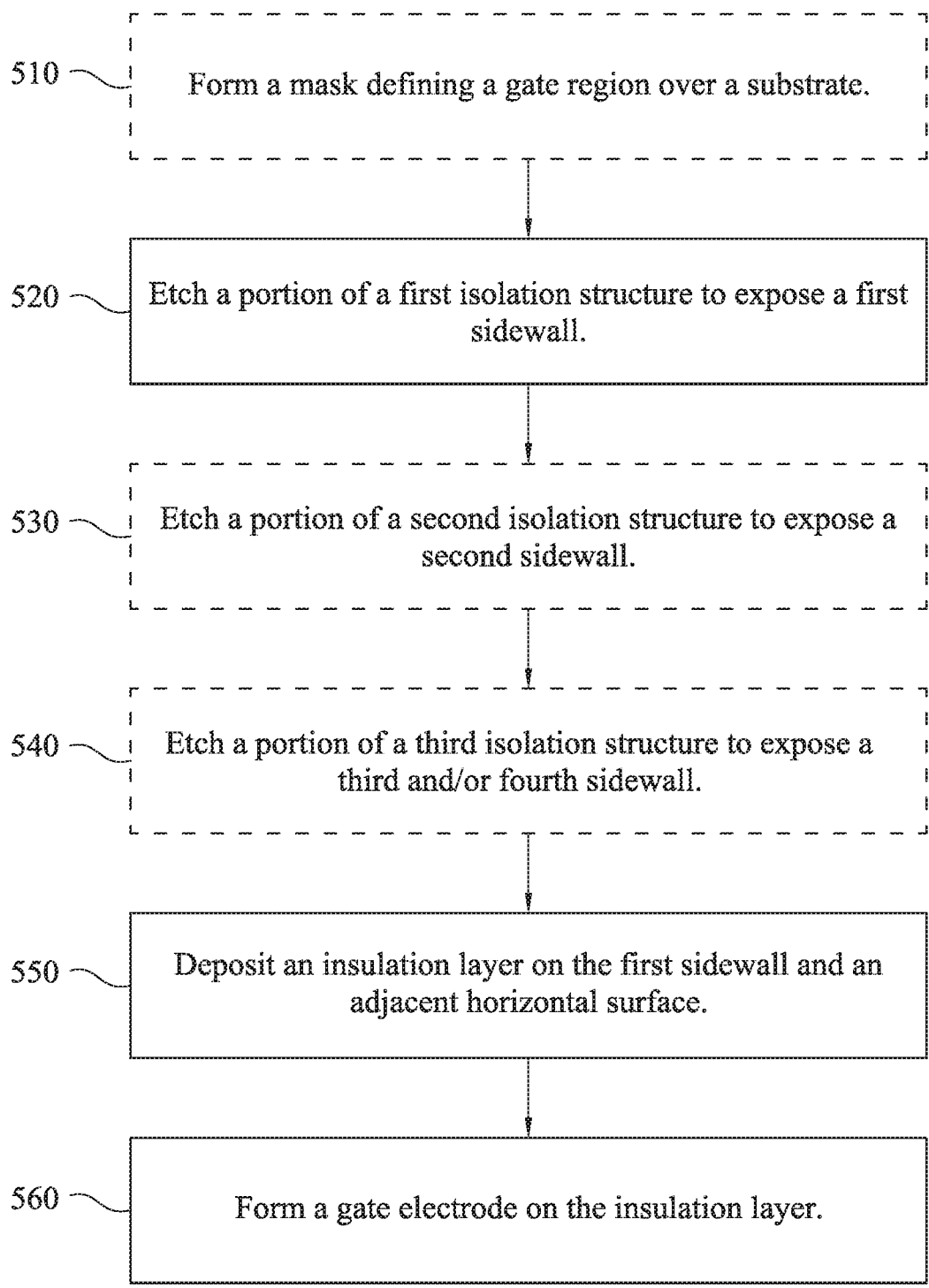
FIG. 5 is a flowchart of a method of forming a gate structure, in accordance with some embodiments.

FIG. 5 is a flowchart of a method 500 of forming a gate structure in a substrate, in accordance with one or more embodiments. Method 500 is implemented to manufacture a gate structure such as gate structures 100, 200, and 300, discussed above with respect to FIGS. 1A and 1B, 2A and 2B, and 3A and 3B, respectively.

In some embodiments, method 500 is part of forming a transistor of an image sensor circuit. In some embodiments, method 500 is part of forming one or more of reset transistor RST, transfer gate TG, source follower SF, or selection transistor SEL of image sensor circuit 400, described above with respect to FIG. 4.

The sequence in which the operations of method 500 are depicted in FIG. 5 is for illustration only; the operations of method 500 are capable of being executed in sequences that differ from that depicted in FIG. 5. In some embodiments, operations in addition to those depicted in FIG. 5 are performed before, between, and/or after the operations depicted in FIG. 5.

At operation 510, in some embodiments, a mask defining a gate region is formed. The gate region overlaps at least a portion of a first isolation structure. In some embodiments, the first isolation structure is isolation structure 120, described above with respect to gate structures 100 and 200 and FIGS. 1A-2B. In some embodiments, the first isolation structure is an isolation structure corresponding to isolation structures 330A and 330B, described above with respect to gate structure 300 and FIGS. 3A and 3B.

In some embodiments, the gate region overlaps at least a portion of a second isolation structure. In some embodiments, the second isolation structure is isolation structure 130, described above with respect to gate structures 100 and 200 and FIGS. 1A-2B. In some embodiments, the second isolation structure is isolation structure 320, described above with respect to gate structure 300 and FIGS. 3A-3B.

In some embodiments, the gate region overlaps at least a portion of a third isolation structure. In some embodiments, the third isolation structure is isolation structure 250, described above with respect to gate structures 100 and 200 and FIGS. 1A-2B. In some embodiments, the third isolation structure is isolation structure 340, described above with respect to gate structure 300 and FIGS. 3A-3B.

At operation 520, a portion of the first isolation structure is etched to expose a first sidewall of the substrate. The exposed portion of the first sidewall is adjacent to a horizontal surface of the substrate.

In some embodiments, etching the portion of the first isolation structure includes exposing a portion of the first sidewall and leaving a portion of the first sidewall unexposed. In some embodiments, etching the portion of the first isolation structure includes exposing an entirety of the first sidewall.

In some embodiments, etching the portion of the first isolation structure includes etching a portion of isolation structure 120 to expose a first sidewall of substrate 150, described above with respect to gate structures 100 and 200 and FIGS. 1A-2B.

In some embodiments, etching the portion of the first isolation structure includes etching a center portion of the first isolation structure to divide the first isolation structure into a first section separate from a second section. In some embodiments, etching the portion of the first isolation structure includes etching a center portion of the first isolation structure to form isolation structures 330A and 330B, described above with respect to gate structure 300 and FIGS. 3A and 3B.

In some embodiments, etching the portion of the first isolation structure includes etching an entirety of the first isolation structure to form a recess corresponding to sidewalls 311-314 and horizontal surface 316, described above with respect to gate structure 300 and FIGS. 3A and 3B.

At operation 530, in some embodiments, a portion of a second isolation structure is etched to expose a second sidewall of the substrate adjacent to the horizontal surface of the substrate. In some embodiments, etching the portion of the second isolation structure includes etching a portion of isolation structure 130, described above with respect to gate structure 100 and FIGS. 1A and 1B.

In some embodiments, etching the portion of the second isolation structure includes exposing a portion of a second sidewall and a portion of a third sidewall and leaving portions of the second sidewall and the third sidewall unexposed. In some embodiments, etching the portion of the second isolation structure includes exposing an entirety of a second sidewall and an entirety of a third sidewall. In some embodiments, etching the portion of the second isolation structure includes etching a portion of isolation structure 250, described above with respect to gate structure 200 and FIGS. 2A and 2B.

At operation 540, in some embodiments, a third isolation structure is etched to expose a third and/or fourth sidewall of the substrate. In some embodiments, etching the portion of the third isolation structure includes etching a portion of isolation structure 130, described above with respect to gate structure 200 and FIGS. 2A and 2B.

At operation 550, an insulation layer is deposited on the first sidewall of the substrate and on the adjacent horizontal surface of the substrate. In some embodiments, depositing the insulation layer includes depositing multiple insulator films.

In some embodiments, depositing the insulation layer includes depositing the insulation layer on the second sidewall. In some embodiments, depositing the insulation layer includes depositing the insulation layer on a third sidewall, a fourth sidewall, and a second horizontal surface of the substrate between the third sidewall and the fourth sidewall.

In some embodiments, depositing the insulation layer includes forming insulation layer 110A, described above with respect to gate structure 100 and FIGS. 1A and 1B. In some embodiments, depositing the insulation layer includes forming insulation layer 210A, described above with respect to gate structure 200 and FIGS. 2A and 2B. In some embodiments, depositing the insulation layer includes forming insulation layer 310A, described above with respect to gate structure 300 and FIGS. 3A and 3B.

At operation 560, a gate electrode is formed on the deposited insulation layer. In some embodiments, forming the gate electrode includes forming gate electrode 110B, described above with respect to gate structure 100 and FIGS. 1A and 1B. In some embodiments, forming the gate electrode includes forming gate electrode 210B, described above with respect to gate structure 200 and FIGS. 2A and 2B. In some embodiments, forming the gate electrode includes forming gate electrode 310B, described above with respect to gate structure 300 and FIGS. 3A and 3B.

The operations of method 500 enable manufacture of a gate structure defining a large effective channel width relative to similarly sized structures without at least one height component, such as heights 112H, 113H, 211H, 212H, 311H, or 312H, thereby enabling FET operation in which device speed and signal-to-noise ratio are increased, thereby improving performance of FETs and FET circuits. As a non-limiting example, an image sensor circuit having one or more of a reset transistor, a transfer gate, a source follower, or a selection transistor including a gate structure formed using method 500 has improved speed and signal-to-noise ratio properties compared to an image sensor circuit having transistors formed using methods for manufacturing gate structures defining effective channel widths without at least one height component, such as heights 112H, 113H, 211H, 212H, 311H, or 312H.

In some embodiments, a gate structure includes a gate and a first isolation structure having a top surface and a bottom surface. The gate includes a first sidewall adjacent to the first isolation structure, a second sidewall, a first horizontal surface adjacent to a bottom edge of the first sidewall and a bottom edge of the second sidewall, the first horizontal surface being between the top surface of the first isolation structure and the bottom surface of the first isolation structure. The gate also includes a second horizontal surface adjacent to a top edge of the second sidewall. An effective channel width defined by the gate structure includes a height of the second sidewall and a width of the second horizontal surface.

In some embodiments, a gate structure includes a gate and a first isolation structure having a bottom surface. The gate includes a first sidewall adjacent to the first isolation structure, a second sidewall perpendicular to the first sidewall, a first horizontal surface adjacent to a bottom edge of the first sidewall and a bottom edge of the second sidewall, the first horizontal surface being coplanar with the bottom surface of the first isolation structure, and a second horizontal surface adjacent to a top edge of the second sidewall. An effective channel width defined by the gate structure includes a height of the second sidewall and a width' of the second horizontal surface.

In some embodiments, a method of forming a gate structure in a substrate includes etching a portion of a first isolation structure to expose a first sidewall of the substrate, depositing an insulation layer on the first sidewall and an adjacent horizontal surface of the substrate, and forming a gate electrode on the deposited insulation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a gate structure in a substrate, the method comprising:
    etching a portion of a first isolation structure to expose a first sidewall of the substrate;
    depositing an insulation layer on the first sidewall and an adjacent horizontal surface of the substrate; and
    forming a gate electrode on the deposited insulation layer.

2. The method of claim 1, wherein etching the portion of the first isolation structure comprises exposing a portion of the first sidewall.

3. The method of claim 1, further comprising:
    etching a portion of a second isolation structure to expose a second sidewall of the substrate, the second sidewall being adjacent to the horizontal surface of the substrate,
    wherein depositing the insulation layer comprises depositing the insulation layer on the second sidewall.

4. The method of claim 3, wherein
    etching the portion of the second isolation structure comprises exposing a third sidewall of the substrate,
    the method further comprises etching a portion of a third isolation structure to expose a fourth sidewall of the substrate, and
    depositing the insulation layer comprises depositing the insulation layer on the third sidewall, the fourth sidewall, and a second horizontal surface of the substrate between the third sidewall and the fourth sidewall.

5. The method of claim 4, wherein etching the portion of the second isolation structure comprises exposing a portion of the second sidewall and a portion of the third sidewall.

6. The method of claim 4, wherein etching the portion of the second isolation structure comprises exposing an entirety of the second sidewall and an entirety of the third sidewall.

7. The method of claim 1, wherein etching the portion of the first isolation structure comprises dividing the first isolation structure into a first section separate from a second section.

8. The method of claim 1, wherein forming the gate structure in the substrate is part of forming a transistor of an image sensor.

9. A method of forming a semiconductor device, the method comprising:
    etching a plurality of isolation structures to expose a plurality of surfaces of a substrate, wherein at least one surface of the plurality of surfaces of the substrate is angled with respect to a top surface of the substrate;
    depositing an insulation layer over each surface of the plurality of surfaces;
    depositing a conductive layer over the insulation layer, wherein the conductive layer directly contacts at least one isolation structure of the plurality of isolation structures.

10. The method of claim 9, wherein the etching of the plurality of isolation structures comprises exposing a sidewall of at least one isolation structure of the plurality of isolation structures.

11. The method of claim 9, wherein the etching of the plurality of isolation structures s comprises exposing only a top surface of at least one isolation structure of the plurality of isolation structures.

12. The method of claim 9, wherein the depositing of the conductive layer comprises depositing the conductive layer directly on each isolation structure of the plurality of isolation structures.

13. The method of claim 9, wherein the depositing of the conductive layer comprises depositing the conductive layer directly contacting a sidewall of at least one isolation structure of the plurality of isolation structures.

14. The method of claim 9, further comprising forming a plurality of source/drain (S/D) regions spaced from the plurality of isolation structures.

15. The method of claim 9, wherein the depositing of the conductive layer comprises deposing the conductive layer over an entire top surface of at least one isolation structure of the plurality of isolation structures.

16. A method of forming a semiconductor device, the method comprising:
    etching a plurality of isolation structures to expose a plurality of surfaces of a substrate; and
    forming a transistor structure on the substrate, wherein the forming of the transistor structure comprises:
        depositing an insulation layer over each surface of the plurality of surfaces;
        depositing a conductive layer over the insulation layer, wherein the conductive layer directly contacts at least one isolation structure of the plurality of isolation structures; and
        forming a plurality of source/drain (S/D) regions in the substrate, wherein the plurality of S/D regions are spaced from the plurality of isolation structures.

17. The method of claim 16, wherein the etching of the plurality of isolation structures comprises forming at least one surface of the plurality of surfaces angled with respect to a top surface of the substrate.

18. The method of claim 16, wherein the depositing of the insulation layer comprises depositing the insulation layer exposing a portion of each isolation structure of the plurality of isolation structures.

19. The method of claim 16, wherein the depositing of the insulation layer comprises depositing the insulation layer over a first region of the substrate and over a second region of the substrate, wherein the first region is spaced from the second region, and the insulation layer over the first region is discontinuous with the insulation layer over the second region.

20. The method of claim 19, wherein the depositing of the conductive layer comprises depositing a continuous conductive layer over the first region and the second region.

* * * * *